United States Patent [19]
Bell et al.

[11] 4,068,373
[45] Jan. 17, 1978

[54] COMPONENT INSERTION MACHINE

[75] Inventors: Terry Lee Bell; Lyle G. Call, both of Boulder; George Omer Dillan, Longmont; James Phillip Jackson, Jr., Longmont; Larry Albin Johnson, Longmont, all of Colo.

[73] Assignee: International Business Machines Corporation, Armonk, N.Y.

[21] Appl. No.: 730,496

[22] Filed: Oct. 7, 1976

[51] Int. Cl.² .............................................. H05K 3/30
[52] U.S. Cl. ........................................ 29/741; 29/759
[58] Field of Search ................ 29/739, 740, 741, 759, 29/626, 714, 715

[56] References Cited
U.S. PATENT DOCUMENTS 3,893,232   7/1975   Fletcher et al. ..................... 29/626

Primary Examiner—Carl E. Hall
Attorney, Agent, or Firm—Herbert F. Somermeyer

[57] ABSTRACT

An improved component feed mechanism allows a component support table to move simultaneously with the component feed mechanism. The table has a plurality of guides for urging guiding component holding cartridges toward a work station. The table is movable transverse to the cartridge lengths. A friction block guide disposed above said table has a block movable parallel to said cartridge feed direction. A feed lever is pivoted on said block; means sense pivoted positions of said feed lever; and means selectively pivot said feed lever between cartridge engaging and retracted positions. The table moves transversely only when said feed lever is in a retracted position enabling concurrent motions of the feed lever and the table for reducing setup time of the machine.

5 Claims, 2 Drawing Figures

4,068,373

COMPONENT INSERTION MACHINE

DOCUMENT INCORPORATED BY REFERENCE

The present invention is an improvement over the machine shown in U.S. Pat. No. 3,893,232.

BACKGROUND OF THE INVENTION

This invention relates to apparatus for inserting components into circuits and particularly to machines for inserting multilead nonradial components of mixed sizes and minimal setup times.

The machine shown and described in U.S. Pat. No. 3,893,232 shows a component insertion machine having a movable table 104 and module loading cylinder 116, also as shown in FIG. 1 of the present application. As described in detail later, when diverse components are to be inserted in a series of machine operations the throughout (modules inserted per hour) is reduced because of time required to move cylinder 116 to a home position as shown in FIG. 1 and the table 104 for aligning a new module type with a work station including insertion driver 108.

It is desired to increase throughput of the referenced machine while enabling inserting a great diversity of module types.

SUMMARY OF THE INVENTION

It is an object of this invention to provide apparatus and methods for inserting diverse module types into a support circuit board at high speed.

A component machine made in accordance with the present invention has a component feed mechanism allowing a component support table to move simultaneously with a module feed mechanism; said table having a plurality of cartridge guides for urging and guiding holding module-containing cartridges toward a work station. The component support table is movable transverse to the cartridge feed direction. A friction block guide is disposed above said table, a block in said guide is movable parallel to said cartridge feed direction. A feed lever is pivoted on said block; means sense pivoted positions of said feed lever; means selectively pivot said feed lever between cartridge engaging and retracted positions; and means actuate said table for transverse motions only when said feed lever is in said retracted position and means for moving said feed lever irrespective of the position of said table.

The foregoing and other objects, features and advantages of the invention will become apparent from the following more particular description of the preferred embodiment, as shown in the accompanying drawing.

THE DRAWINGS

FIG. 1 is a three-dimensional view of apparatus of U.S. Pat. No. 3,893,232 with which the present invention can be advantageously employed.

Fig. 2 is a diagrammatic showing of the invention as employed in the FIG. 1 illustrated apparatus.

DETAILED DESCRIPTION

Figure 1:
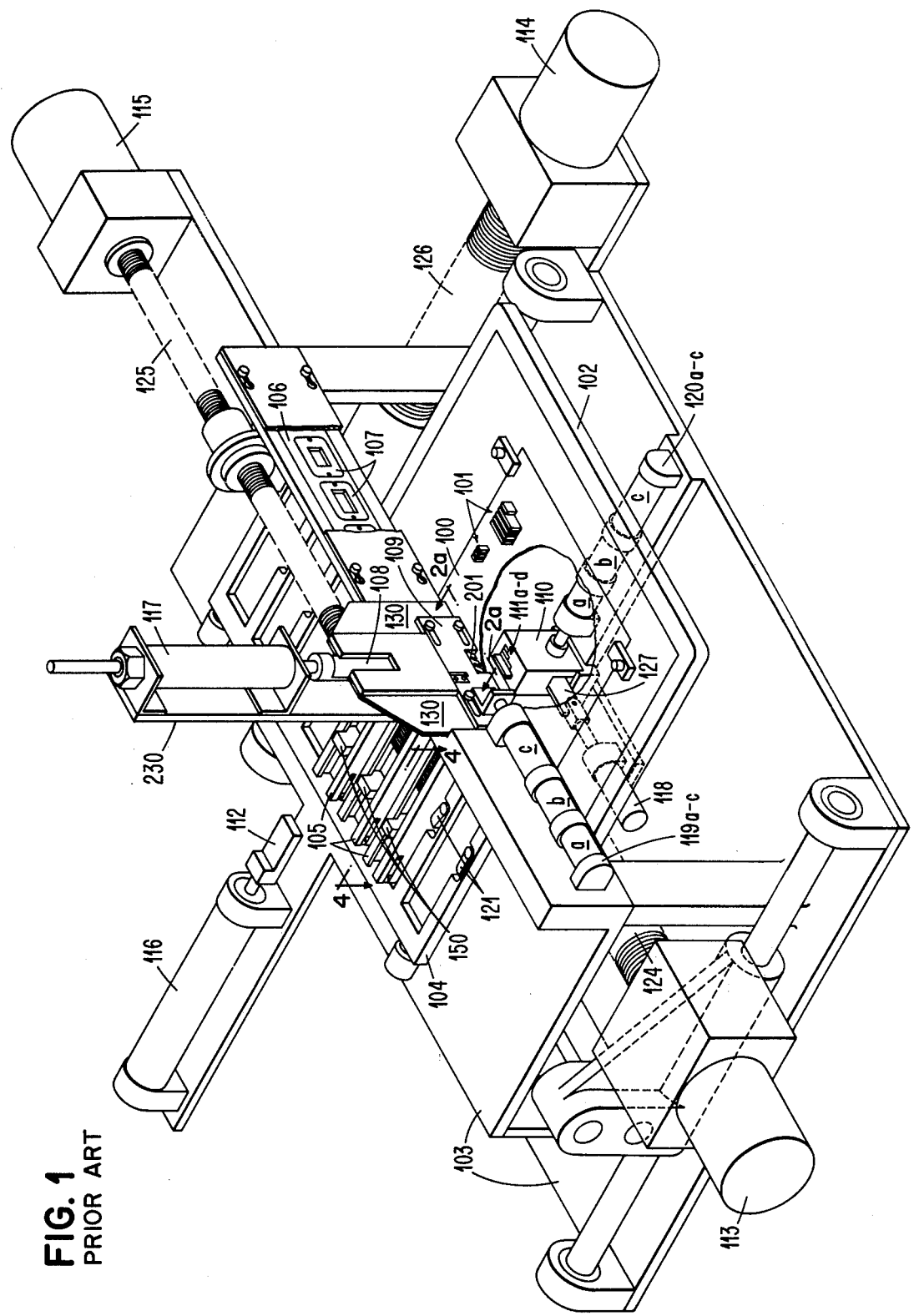

Referring now to FIG. 1, the illustrated component insertion machine inserts diverse types of circuit components or modules into a circuit board 100. Circuit board 100 is to be populated with modules 101 which are placed into holes (not shown) provided in the circuit board. The circuit board 100 is mounted on X-Y indexing table 102 which is generally supported by a large base memeber 103. An indexable magazine support 104 on the base 103 carries a plurality of retainers or magazines 105 for storing additional circuit modules 101. As can be seen in the drawing, the magazines have a variety of widths for accomodating a variety of module sizes. An indexible slide 106 moves with the indexable magazine support 104 to expose at a central point one of a plurality of interchangeable aperture plates 107. Each of the aperture plates 107 is associated with a different one of the magazines 105 and has an inner perimeter determined by the outer bounds of the module including its pins. The currently used magazine and its corresponding aperture are positioned in line with the central point, called the "insertion point" and "work station" herein, defined by the position of a vertically movable insertion driver 108. The insertion driver 108 moves inside a slot of a backing plate 130. An independently movable module guide 109 is moved horizontally to adjust for module size. It will be understood that "horizontal" and "vertical" as used herein are merely illustrative because the invention is not dependent upon gravity. The module guide 109 and backing plate 130 together retain a module received from one of the magazines via one of the aperture plates 107. As will be explained in greater detail, the guide 109 is adjusted to the module size by moving it toward one side of the module, while another, opposing, side of the module is held in contact with one wall of the backing plate 130 slot.

An anvil support 110 holds a plurality of anvils 111 and which may be positioned one at a time into alignment with the module guide 109 and the module held therein. Modules are fed from the magazines 105 into the module guide 109 by a loading driver 112 which contacts a backing block 150 in each of the magazines 105. As explained in U.S. Pat. No. 3,893,232, latches 121 are adjusted to permit magazine support 104 to accommodate different size magazines.

The X-Y indexing table 102 on which the circuit board 100 is mounted is positioned relative to the module guide 109 and anvil support 110 by adjustment of shafts 124 and 126 connected to an X drive motor 113 and a Y drive motor 114. An example of a commercially available assembly combining the table and the drives is the Type NC300 SLO-SYN N/C Positioning Table available from the Superior Electric Co., Bristol, Conn. The indexable slide 106 and indexable magazine support 104 are moved by adjustment of a shaft 125 driven by a magazine indexing drive motor 115. A number of (hydraulically, pneumatically, electrically or otherwise operated) cylinders 116, 117, 118, 119a–c and 120a–c are provided for activating various linear operations in the apparatus. For example, the loading driver 112 is driven forward by the module loading cylinder 116, the insertion driver 108 is driven downward by the insertion cylinder 117 and an anvil is driven upward when cylinder 118 moves an anvil cam 127 under the selected one of anvils 111a–d. Indexing of the movable module guide 109 and the anvil support 110 are performed by respective ones of guide indexing cylinders 119a–c and anvil indexing cylinders 120a–c. The guide indexing cylinders 119a–c including three stepping sections a, b and c, shown as having different lengths. Activation of cylinder section a causes a single increment of movement, activation of section b causes two increments of movement and activation of section c causes three increments of movement. Thus, four module guide 109 positions are obtained; three increments of movement in addition to the deactivated position. Obviously, additional module sizes can be accommodated by adding additional cylinder sections. An alternative design would use series-connected sections, so that cumulative increments of movement occur as a function of the number of cylinders activated. Anvil indexing cylinders 120a-c similarly include three sections a through c which expose one of the anvils when deactivated, a second anvil when the first section is activated, a third anvil when the second section is activated, etc.

In operation, the circuit board 100 is positioned by rotating the X drive motor 113 or the Y drive motor 114, or both, for each different module to be placed on the board. A magazine 105 containing the desired modular size is positioned by rotating the magazine indexing drive motor 115 to align the desired magazine and the corresponding aperture 107 with the insertion driver 108 and module guide 109. The module guide 109 may be adjusted by guide indexing cylinders 119a-c to move it toward one side of the module before or during the time that a module is fed from a magazine by module loading cylinder 116. At one of these times, the anvil indexing cylinders 120a-c adjust the anvil support 110 to bring into position one of the anvils 111a-d corresponding to the size of the module. Subsequently, the anvil camming cylinder 118 brings upward the selected one of the anvils 111a-d under the circuit board and the insertion cylinder 117 causes the insertion driver 108 to drive the module down onto the selected anvil. Operation of the FIG. 1 illustrated machine is as described in greater detail in U.S. Pat. No. 3,893,232.

Figure 2:
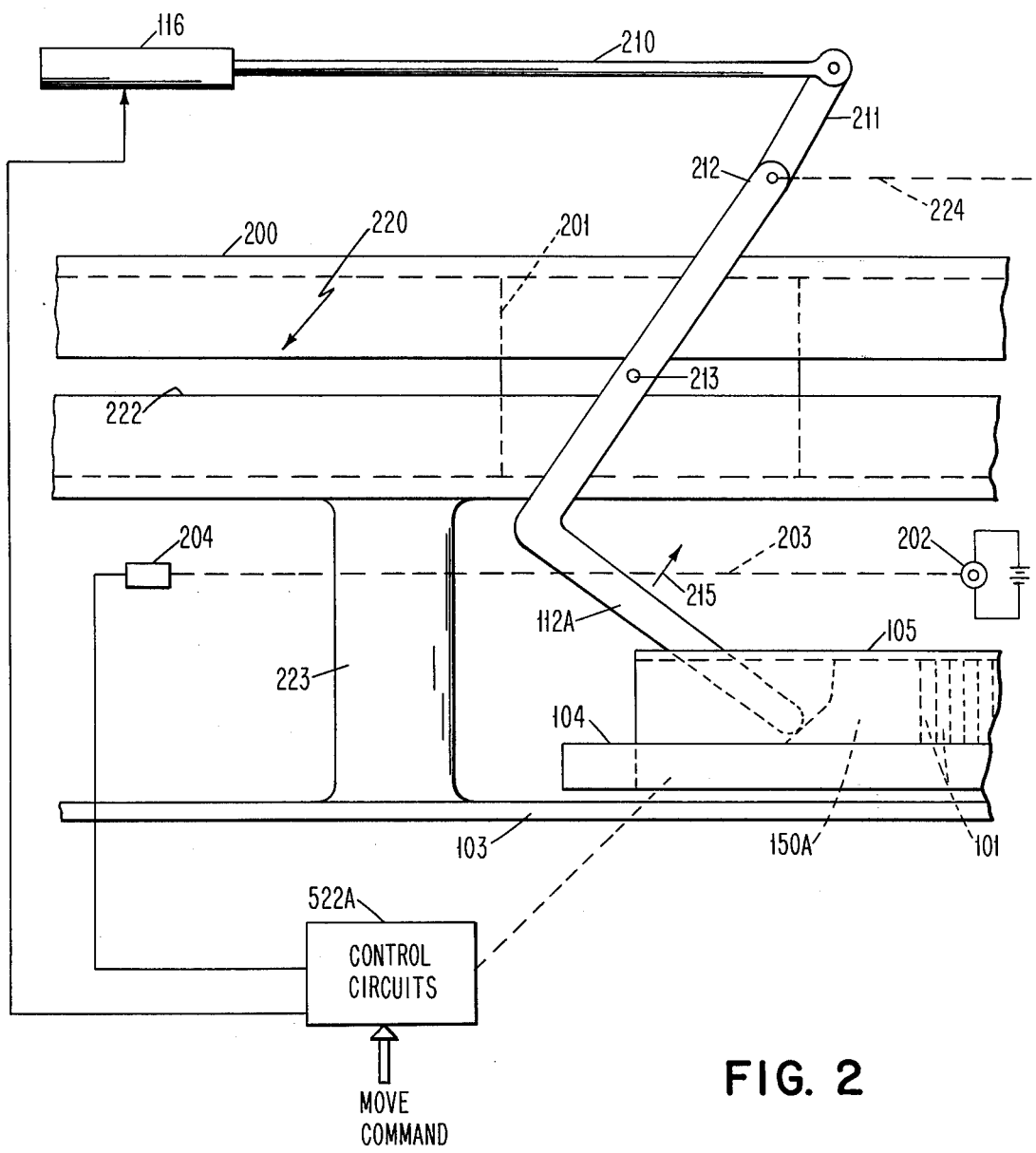

FIG. 2, the inventive modification of the FIG. 1 illustrated apparatus, is shown in diagrammatic partial detail. The remainder of the machine operates as aforedescribed except that shortly after module loading cylinder 116 starts to retract, table 104 is actuated as will be hereinafter described. A friction slide guide 200 is disposed in a direction parallel to the movement of the modules toward the work station including driver 108. Guide 200 frictionally supports a slide block 201 for frictionally retarding motion of pivoted loading driver 112a. The FIG. 2 illustration shows loading driver 112a in contact with backing block follower 150a of a magazine 105. Driving cylinder 116 has sufficient pneumatic pressure from a source (not shown) for urging loading driver 112a against follower 150a such that modules 101 are urged toward work station aperture plate 107. When in this position a control circuit including a collimated light source 202 shines light along light path 203 toward photosensor 204. When loading driver 112a is in the illustrated loading position it intercepts the light along the path 203 preventing the light from reaching sensor 204. This fact is supplied to control circuits 522a, a modification of the control circuits of U.S. Pat. No. 3,893,232. When sensor 204 indicates to circuits 522a that it is not receiving any light, motion of table 104 over frame 103 is inhibited.

As modules 101 are inserted into circuit board 100 the pressure in loading cylinder 116 moves thin rod 210 to the right as shown in FIG. 2. This urging is transmitted via connecting link 211 to the upper end 212 of pivoted loading driver 112a. It can be seen that as thin rod 210 moves to the right, the force is transmitted to follower 150a for urging modules 101 toward the work station including insertion driver 108.

Friction block 201 has just enough friction such that loading cylinder 116 can cause loading driver 112a to pivot about its pivot pin 213. The longitudinal extent of guide 200 is substantially equal to the stroke of loading driver 112a which is equal to the longitudinal extent of magazines 105, as best seen in FIG. 1.

When table 104 is to be moved transversely to the direction of module 101 feeding direction, control circuits 522a actuate loading cylinder 116 via its pressure sources (not shown) to retract rod 210. This action causes loading driver 112a to pivot about axis 213 in the direction of arrow 215 thereby moving loading driver 112a out of light path 203. Immediately sensor 204 senses light from path 203 and enables control circuits 522a to move table 104 to the next desired position. In this regard it should be understood that loading driver 112a may be in juxtaposition to the work station, including insertion driver 108. In this regard as soon as loading cylinder 116 pivots loading driver 112a to the non-light path interfering position it will continue to retract friction block 201 toward a home position as at 220. Simultaneously, control circuits 522a actuate table 104 to the next magazine 105 position for receiving the next module to be inserted into circuit board 100. Accordingly, as loading lever 112a is moved to home position 220, table 104 is simultaneously moved for positioning a next selected magazine 105 in the work position. Since it is not known how many modules 101 are in the new magazine 105 loading lever 112a is moved to the home position then moved forwardly until a next follower 150a is engaged for moving the next modules 101 toward the work station. Since the pressure of loading cylinder 116 is constant, lever 112a motion stops as soon as the follower 150a is engaged and one module 101 is in an aperture plate 107. Upon removal of each module from a magazine 105 cylinder 116 again moves follower 112a to the right as shown in FIG. 2 equal to the thickness of an inserted module.

Friction block guide 200 is shown as a channel-shaped member having a longitudinal slot 222 which receives pivot pin 213 of loading lever 112a. Guide 200 is disposed over the top of movable table 104 a sufficient distance to enable loading driver 112a to clear the top of magazines 105 when in the retracted or non-light path interfering position. An upstanding member 223 supports one end of guide 200 while the other end is secured to upstanding member 230 of the work station.

A simplified construction of the invention can be achieved by relocating cylinder 116 to be mounted on frame 103 in juxtaposition to the work station at 108. With this arrangement, a stiff wire (dashed line 224) extends from relocated cylinder 116 to portion 212 of loading driver 112a.

In such an arrangement link 211 is eliminated with improved control of loading lever 112a.

While the invention has been particularly shown and described with reference to preferred embodiments thereof, it will be understood by those skilled in the art that various changes in form and details may be made therein without departing from the spirit and scope of the invention.

We claim:

1. Apparatus for inserting different size circuit modules into a circuit board, each of said circuit modules having two or more leads emerging from a first side thereof, said modules to be inserted into a circuit board;
  a number of positionable module-containing magazines, each of said magazines containing a stack of essentially identically dimensioned modules positioned with their leads parallel with each other;

a table supporting said magazines and being movable transverse to direction of module feed within said magazines;

the improvement including in combination:

a loading driver having an upper actuating end and a lower pushing end;

a friction block guide extending parallel to the direction of module feed and disposed above said movable table;

a friction slide block in said guide for pivotably supporting said loading driver such that said loading driver is pivotable between a module engaging position and a retracted noninterferring position.

2. The apparatus set forth in claim 1 wherein said loading driver has a substantially right angle shape with the apex of said angle being disposed between said magazines and said pivot.

3. The apparatus set forth in claim 1 further including means for sensing the position of said loading driver and including means for inhibiting motion of said table when said loading driver is in other than said retracted position.

4. The apparatus set forth in claim 3 further including pneumatic actuating means operatively connected to said loading lever for urging same into pushing relationship to said modules to be inserted and being operatively connected to said loading driver at an end remote from said engaging end.

5. Apparatus as in claim 4 wherein said pivot axis is intermediate said actuating end and said engaging end and said loading driver further having an angle extent intermediate said pivot axis and said engaging end.

* * * * *